United States Patent

Nakazawa et al.

[11] Patent Number: 5,929,511
[45] Date of Patent: Jul. 27, 1999

[54] LEAD FRAME FOR RESIN SEALED SEMICONDUCTOR DEVICE

[75] Inventors: Eiichi Nakazawa; Takashi Ikeda; Tomohiko Iwasaki; Tadahiko Aiba; Shigeo Yoshida, all of Niigata, Japan

[73] Assignee: Matsushita Electronics Corporation, Osaka, Japan

[21] Appl. No.: 08/891,805

[22] Filed: Jul. 14, 1997

[30] Foreign Application Priority Data

Jul. 15, 1996 [JP] Japan .................................. 8-184616

[51] Int. Cl.⁶ .............................. H01L 23/48; H01L 29/44
[52] U.S. Cl. .......................... 257/666; 257/667; 257/676; 257/698; 257/758; 257/762; 257/766
[58] Field of Search ..................................... 257/666, 667, 257/676, 678, 687, 698, 753, 758, 762, 766, 787

[56] References Cited

U.S. PATENT DOCUMENTS

| | | | |
|---|---|---|---|
| 5,018,003 | 5/1991 | Yasunaga et al. | 257/791 |
| 5,096,853 | 3/1992 | Yosunaga et al. | 29/827 |
| 5,139,969 | 8/1992 | Mori | 438/123 |
| 5,153,706 | 10/1992 | Baba et al. | 257/676 |
| 5,223,738 | 6/1993 | Okada | 257/666 |
| 5,368,805 | 11/1994 | Motai | 264/272.15 |
| 5,371,044 | 12/1994 | Yoshida et al. | 257/667 |
| 5,451,813 | 9/1995 | Kazutaka | 257/676 |
| 5,463,247 | 10/1995 | Futatsuka et al. | 257/666 |
| 5,633,206 | 5/1997 | Kim et al. | 438/123 |
| 5,645,864 | 7/1997 | Higashi | 264/272.17 |
| 5,659,199 | 8/1997 | Mori et al. | 257/676 |
| 5,672,550 | 9/1997 | Tsuji et al. | 264/272.17 |
| 5,684,327 | 11/1997 | Nakazawa et al. | 257/667 |
| 5,691,241 | 11/1997 | Kazataka | 257/672 |
| 5,753,968 | 5/1998 | Suzuya et al. | 257/667 |
| 5,766,649 | 6/1998 | Azuma | 264/272.17 |

OTHER PUBLICATIONS

02232957; Abstract of Japan "Lead Frame of Resin Seated Semiconductor Device" Yorchi, Mar. 1989.
040250314; Abstract of Japan "Lead Frame for Semiconductor Device" Yorchi, May 1990.

*Primary Examiner*—Alexander Oscar Williams
*Attorney, Agent, or Firm*—McDermott, Will & Emery

[57] ABSTRACT

A lead frame is made from a body including a Cu layer and stacked plate layers including an Ni layer, a Pd layer and an Au layer formed on the body. The lead frame includes a die pad, die-pad supports, inner leads, dam-bars, outer leads and an outer frame. No Au layer is formed in a gate runner portion. Since the Pd layer with poor adhesion to a sealing resin is exposed in the gate runner portion, the sealing resin remaining in the gate runner portion can be easily removed by punching pilot holes from the rear side after completing a resin sealing procedure. Thus, the lead frame can be definitely prevented from being deformed without providing any additional element.

5 Claims, 7 Drawing Sheets

LEAD FRAME FOR RESIN SEALED SEMICONDUCTOR DEVICE

BACKGROUND OF THE INVENTION

The present invention relates to a lead frame for a resin sealed semiconductor device in which a sealing resin remaining in a gate runner portion can be removed with ease.

A lead frame used in a resin sealed semiconductor device is conventionally required to have good adhesion to a sealing resin in order to prevent invasion of moisture through a gap between the sealing resin and the lead frame. Also, the lead frame is required to have corrosion resistance in order to prevent corrosion due to moisture. For the purpose of meeting such requirements, many of the conventional lead frames are provided with gold plate as the outermost layer on their bodies.

Now, the structure of the conventional lead frame for a resin sealed semiconductor device will be described with reference to the accompanying drawing.

Figure 7:
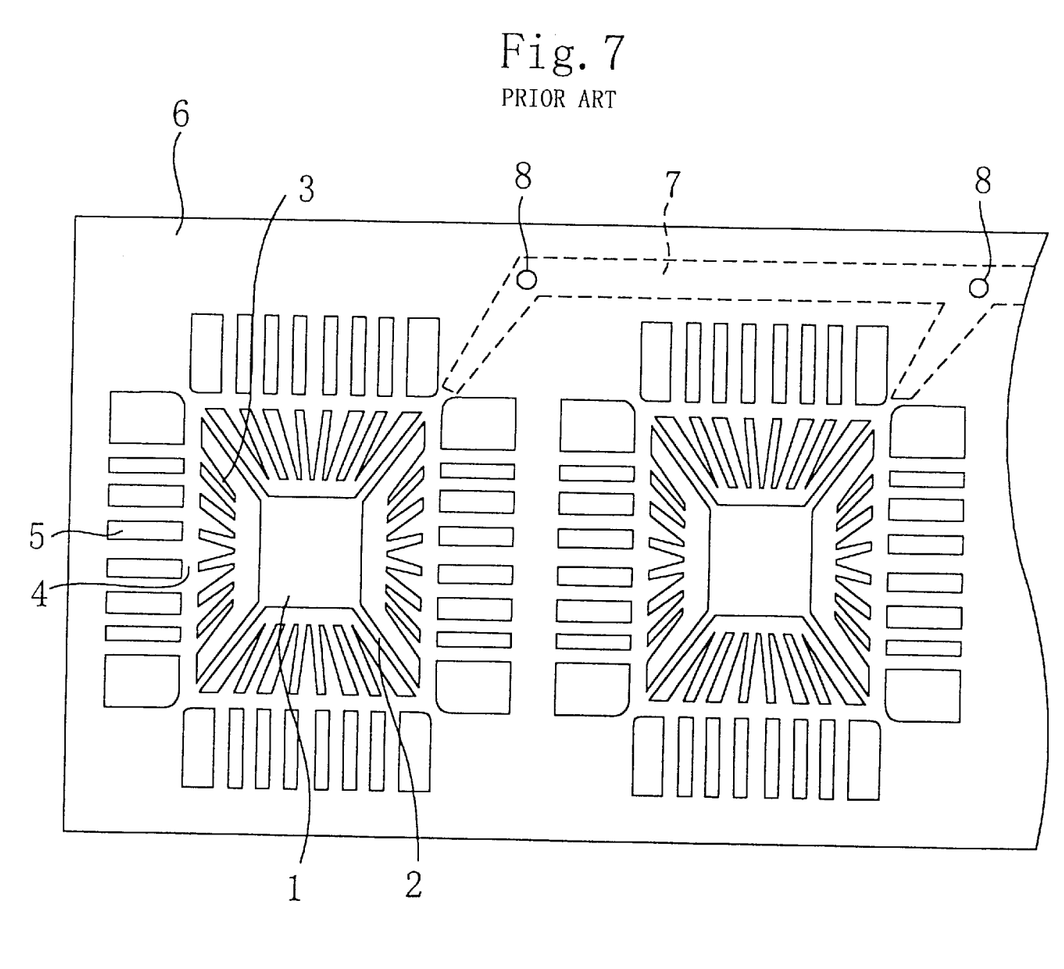
FIG. 7 is a plan view of a conventional lead frame for a resin sealed semiconductor device.

FIG. 7 is a plan view of the conventional lead frame for a resin sealed semiconductor device. As is shown in FIG. 7, the conventional lead frame for a resin sealed semiconductor device comprises a die pad 1, die-pad supports 2 for supporting the die pad 1, inner leads 3, dam-bars 4 for connecting the inner leads 3, outer leads 5 connected with the inner leads 3, and an outer frame 6 for externally supporting these elements. An area extending outward from substantially the base of the die-pad support 2 of this lead frame and extending further along the outer side of the outer frame 6 (i.e., an area surrounded with broken lines in FIG. 7) works as a gate runner portion 7 for allowing the sealing resin to flow to a cavity in a resin sealing procedure. Also, the gate runner portion 7 is provided with pilot holes 8 for positioning and removal of the sealing resin. This conventional lead frame for a resin sealed semiconductor device is made from a body including copper (Cu) (or a copper alloy) as a substrate metal, and bearing a nickel (Ni) layer and a palladium (Pd) layer as underlying plate layers and a gold (Au) layer as the outermost layer.

A semiconductor device is manufactured by using such a lead frame for a resin sealed semiconductor device as follows:

First, a semiconductor chip is mounted on the die pad 1 of the lead frame for a resin sealed semiconductor device, and the semiconductor chip is electrically connected with the inner leads 3 of the lead frame through wires. Then, an area including the semiconductor chip, the die pad 1, the inner leads 3 and the die-pad supports 2 is sealed with a sealing resin. The sealing resin is injected through the gate runner portion 7 of the lead frame, and the sealing resin remains in the gate runner portion 7 after completing the resin sealing procedure. The sealing resin thus remaining in the gate runner portion 7 of the lead frame is peeled by, for example, punching the pilot holes 8 from the rear face, and subsequent procedures for marking, lead-cutting and lead-forming are carried out.

The conventional lead frame for a resin sealed semiconductor device has, however, the following problem:

The lead frame made from a Cu material bears the Ni layer, the Pd layer and the Au layer successively formed on the surface thereof, and the outermost layer is the Au layer. This Au layer can advantageously improve the adhesion to the sealing resin and prevent the invasion of moisture, but the Au layer also causes a trouble in removing the sealing resin remaining in the gate runner portion 7 in the subsequent procedure. This is because Au has good adhesion to an epoxy sealing resin. When the sealing resin remaining in the gate runner portion 7 and rigidly adhered to the lead frame is to be removed, it is necessary to punch the pilot holes 8 from the rear side with a larger force. This large punching force can disadvantageously deform the lead frame itself.

As a conventional countermeasure against this problem, the gate runner portion is provided with a resin tape or a metal layer having poor adhesion to the sealing resin. However, such addition of another element to the lead frame can lead to restriction in the manufacture of the lead frame and can increase time and cost for the manufacture.

SUMMARY OF THE INVENTION

The object of the invention is providing a lead frame for a resin sealed semiconductor device in which a sealing resin can be easily removed after completing a resin sealing procedure, by providing means for weakening adhesion between the sealing resin remaining in a gate runner portion and the lead frame, without providing any additional element to the lead frame.

In the first and second lead frames for a resin sealed semiconductor device of this invention, a gold layer with good adhesion to the sealing resin is not disposed or the existential proportion of the gold layer is reduced in the gate runner portion.

The first lead frame for a resin sealed semiconductor device of this invention is made from a body of copper or a copper alloy, and a nickel layer, a palladium layer and a gold layer successively formed thereon, and comprises a sealed portion which is sealed with a sealing resin; and a gate runner portion for introducing the sealing resin to the sealed portion, and no gold layer is formed in an area including at least a part of the gate runner portion.

The second lead frame for a resin sealed semiconductor device of this invention is made from a body of copper or a copper alloy, and a nickel layer, a palladium layer and a gold layer successively formed thereon, and comprises a sealed portion which is sealed with a sealing resin; and a gate runner portion for introducing the sealing resin to the sealed portion, and the gold layer is coarsely formed in an area including at least a part of the gate runner portion.

Owing to these structures, the adhesion between the lead frame and the sealing resin remaining in the gate runner portion after completing the resin sealing procedure is degraded in the manufacture of the semiconductor device, and hence, the remaining sealing resin can be easily removed. For example, when the lead frame is provided with holes for punching, the sealing resin can be removed with as a small punching force as not to deform the lead frame.

In addition, since there is no need to provide any additional element to the lead frame for degrading the adhesion, the structures are free from any restriction in the manufacture and are suitable to the manufacturing conditions. Therefore, the time required for the manufacture can be shortened by thus eliminating the gold plate layer or partially making it coarse as compared with, for example, by forming another plate layer with poor adhesion to the sealing resin. In particular, in the mass production, a large number of lead frames are treated, tact in each procedure largely affects the entire manufacturing procedures. Furthermore, such means can cause a problem in a lead frame including a single plate layer, but in the lead frame having the stacked plate structure as in this invention, elimination (or partial elimination) of the gold layer in the area ultimately to be removed cannot lead any problem. In other words, the conception of such means can be achieved merely in the lead frame having the metal films stacked on the body.

In the third lead frame for a resin sealed semiconductor device, the sealing resin can be easily peeled from the lead frame by utilizing thermal shrink occurring after completing the resin sealing procedure.

The third lead frame for a resin sealed semiconductor device of this invention is made from a body of copper or a copper alloy, and a nickel layer, a palladium layer and a gold layer successively formed thereon, and comprises a sealed portion which is sealed with a sealing resin; and a gate runner portion for introducing the sealing resin to the sealed portion, and irregularities each with a tapered side face are formed in an area including at least part of the gate runner portion.

The following function can result from this structure: After completing the resin sealing procedure, the thermal shrink occurs as the temperature decreases. Due to a difference in the coefficient of thermal expansion, the lead frame is largely shrunk than the remaining sealing resin. This thermal stress causes a force to separate the sealing resin from the lead frame on the side faces of the irregularities each in a tapered shape, so that the sealing resin thrust into the irregularities can be peeled. Accordingly, the remaining sealing resin can be easily removed by punching or the like. In addition, there is no need to provide any additional element to the lead frame for degrading the adhesion, the structure is free from any restriction in the manufacture and is suitable to the manufacturing conditions.

In the third lead frame for a resin sealed semiconductor device, the structure of the first or the second lead frame can be additionally adopted.

DETAILED DESCRIPTION OF THE INVENTION

Now, a lead frame for a resin sealed semiconductor device of this invention will be described in detail by way of embodiments.

Embodiment 1

A lead frame for a resin sealed semiconductor device according to a first embodiment will now be described with reference to FIGS. 1 and 2.

Figure 1:
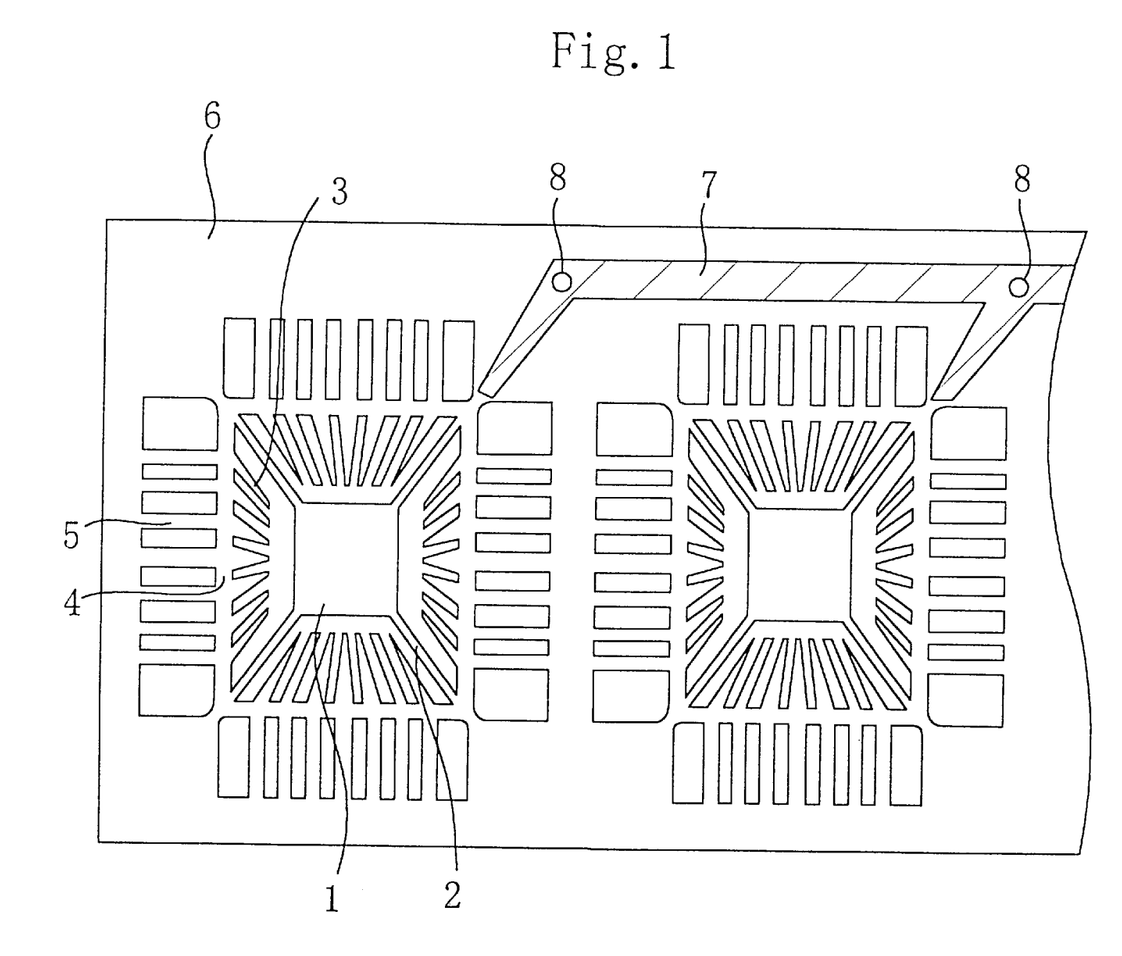
FIG. 1 is a plan view of a lead frame for a resin sealed semiconductor device according to a first embodiment of the invention.

FIG. 1 is a plan view of the lead frame for a resin sealed semiconductor device of the first embodiment. As is shown in FIG. 1, the lead frame for a resin sealed semiconductor device of this embodiment comprises a die pad 1, die-pad supports 2 for supporting the die pad 1, inner leads 3, dam-bars 4 for connecting the inner leads 3, outer leads 5 connected with the inner leads 3, and an outer frame 6 for externally supporting these elements. An area extending outward from substantially the base of the die-pad support 2 of the lead frame and further extending along the outer side of the outer frame 6 (i.e., a hatched area in FIG. 1) works as a gate runner portion 7 for allowing a sealing resin to flow to a cavity in a resin sealing procedure. The gate runner portion 7 is provided with pilot holes 8 which are used for positioning and removal of the sealing resin.

The lead frame is made from a body including copper (Cu) (or a copper alloy) as a substrate metal, and bearing a nickel (Ni) layer with a thickness of 0.5 $\mu$m and a palladium (Pd) layer with a thickness of 0.03 $\mu$m as underlying plate layers, and a gold (Au) layer with a thickness of 0.002 $\mu$m as the outermost layer.

In the lead frame for a resin sealed semiconductor device of this embodiment, the Au layer is not formed in the gate runner portion 7. In other words, the Pd layer is the outermost layer in the gate runner portion 7.

Figure 2:
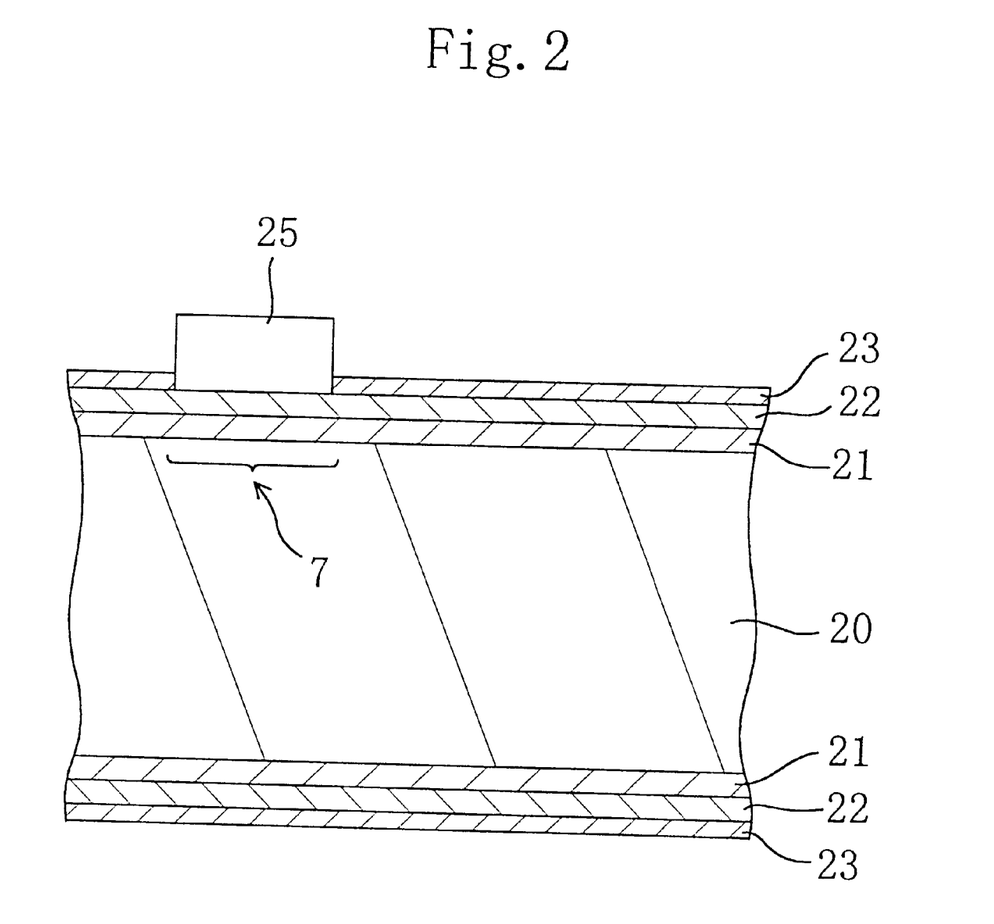
FIG. 2 is a sectional view for showing a gold-plating procedure in which a gold layer is not formed in a gate runner portion alone in the lead frame of the first embodiment.

FIG. 2 is a sectional view of this lead frame for showing the formation of the outermost Au layer. As is shown in FIG. 2, after successively stacking, by plating, the Ni layer 21 and the Pd layer 22 on the body 20 of a copper alloy, a photoresist mask 25 is formed so as to cover the gate runner portion 7. Then, an area not covered with the photoresist mask 25 is plated with gold. Thus, the lead frame in which the gate runner portion 7 alone does not bear the Au layer 23 can be obtained.

In this embodiment, a semiconductor device is manufactured by using the aforementioned lead frame for a resin sealed semiconductor device as follows:

First, a semiconductor chip is mounted on the die pad 1 of the lead frame for a resin sealed semiconductor device, and the semiconductor chip is electrically connected with the inner leads 3 of the lead frame through wires. Then, an area including the semiconductor chip, the die pad 1, the inner leads 3 and the die-pad supports 2 (i.e., a sealed portion) is sealed with a sealing resin. The sealing resin is injected through the gate runner portion 7 of the lead frame, and the sealing resin remains in the gate runner portion 7 after completing the resin sealing procedure. Then, the sealing resin remaining in the gate runner portion 7 of the lead frame is peeled by, for example, punching the pilot holes 8 from the rear side, and subsequent procedures for marking, lead-cutting and lead-forming are carried out.

In the lead frame for a resin sealed semiconductor device of this embodiment, the Au layer is not formed in the gate runner portion 7 as described above, and hence, the Pd layer having poor adhesion to the sealing resin is exposed on the surface of the gate runner portion 7. Accordingly, the sealing resin remaining in the gate runner portion 7 can be removed with ease by punching the pilot holes 8 with a small force from the rear side after completing the resin sealing procedure. In this manner, there is no need to punch the lead frame with a large force, resulting in definitely preventing the lead frame from being deformed.

In addition, there is no need to provide the lead frame with an additional element in order to degrade the adhesion. Therefore, the structure of the lead frame of this embodiment is free from any restriction in the manufacture and is suitable to the manufacturing conditions.

In particular, elimination of a plate layer can cause a problem in the manufacturing procedures for a lead frame including a single plate layer, and hence, it is difficult to apply this embodiment to such a lead frame including a single plate layer. This embodiment and a second embodiment described below are attained in view of the fact that the elimination of the outermost Au layer in an area such as the gate runner portion that is ultimately to be removed causes no problem in a lead frame with a structure including stacked plate layers.

It is noted that a method of not forming the Au layer in the gate runner portion 7 alone is not limited to the partial plating method using the mask as is shown in FIG. 2.

The Au layer in the gate runner portion 7 alone can be partially eliminated by, for example, plating the entire surface of the lead frame with gold and subsequently removing the Au layer in the gate runner portion 7 alone by a chemical treatment or etching. Any of these methods can be appropriately selected in view of cost and time required for the manufacture, etc.

In this embodiment, the Au layer is not formed in the gate runner portion 7 alone. However, the effect of this embodiment can be exhibited as far as the Au layer is not formed in an area including most of the gate runner portion 7, as described in the second embodiment below, so as to degrade the adhesion between the sealing resin remaining in the gate runner portion 7 and the lead frame.

Embodiment 2

A lead frame for a resin sealed semiconductor device of the second embodiment will now be described with reference to FIGS. 3 and 4.

Figure 3:
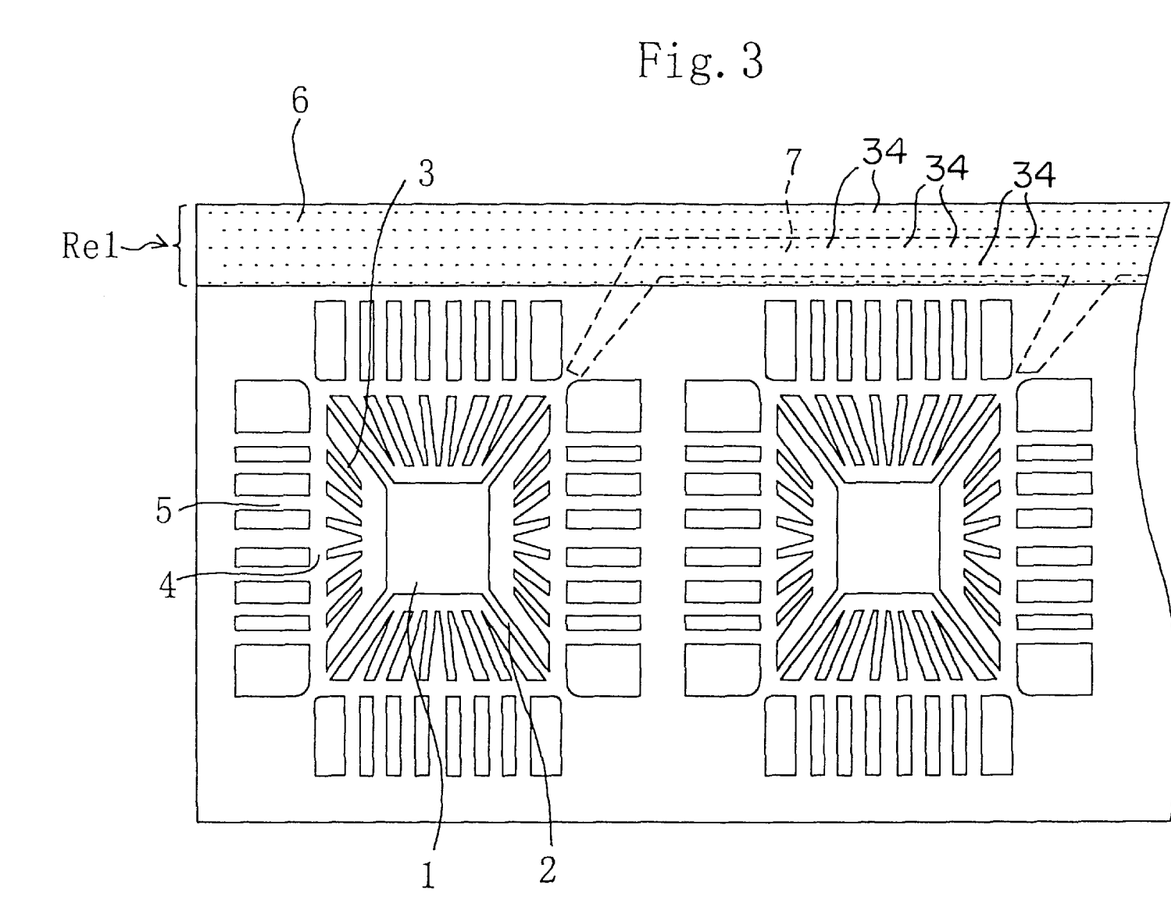
FIG. 3 is a plan view of a lead frame for a resin sealed semiconductor device according to a second embodiment.

FIG. 3 is a plan view of the lead frame for a resin sealed semiconductor device of this embodiment. As is shown in FIG. 3, the lead frame of this embodiment comprises a die pad 1, die-pad supports 2 for supporting the die pad 1, inner leads 3, dam-bars 4 for connecting the inner leads 3, outer leads 5 connected with the inner leads 3, and an outer frame 6 for externally supporting these elements. An area extending outward from substantially the base of the die-pad support 2 and further extending along the outer side of the outer frame 6 (i.e., an area surrounded with broken lines in FIG. 3) works as a gate runner portion 7 for allowing a sealing resin to flow to a cavity in a resin sealing procedure. The gate runner portion 7 is provided with pilot holes 8 used for positioning and removal of the sealing resin.

The lead frame is made from a body including copper (Cu) (or a copper alloy) as a substrate metal, and bearing a nickel (Ni) layer with a thickness of 0.5 $\mu$m and a palladium (Pd) layer with a thickness of 0.03 $\mu$m as underlying plate layers, and a gold (Au) layer with a thickness of 0.002 $\mu$m as the outermost layer.

As a characteristic of the lead frame for a resin sealed semiconductor device of this embodiment, the Au layer in a region Re1, including most of the gate runner portion 7, has a smaller density, namely, the Au layer in the region Re1 is coarsely formed.

Figure 4:
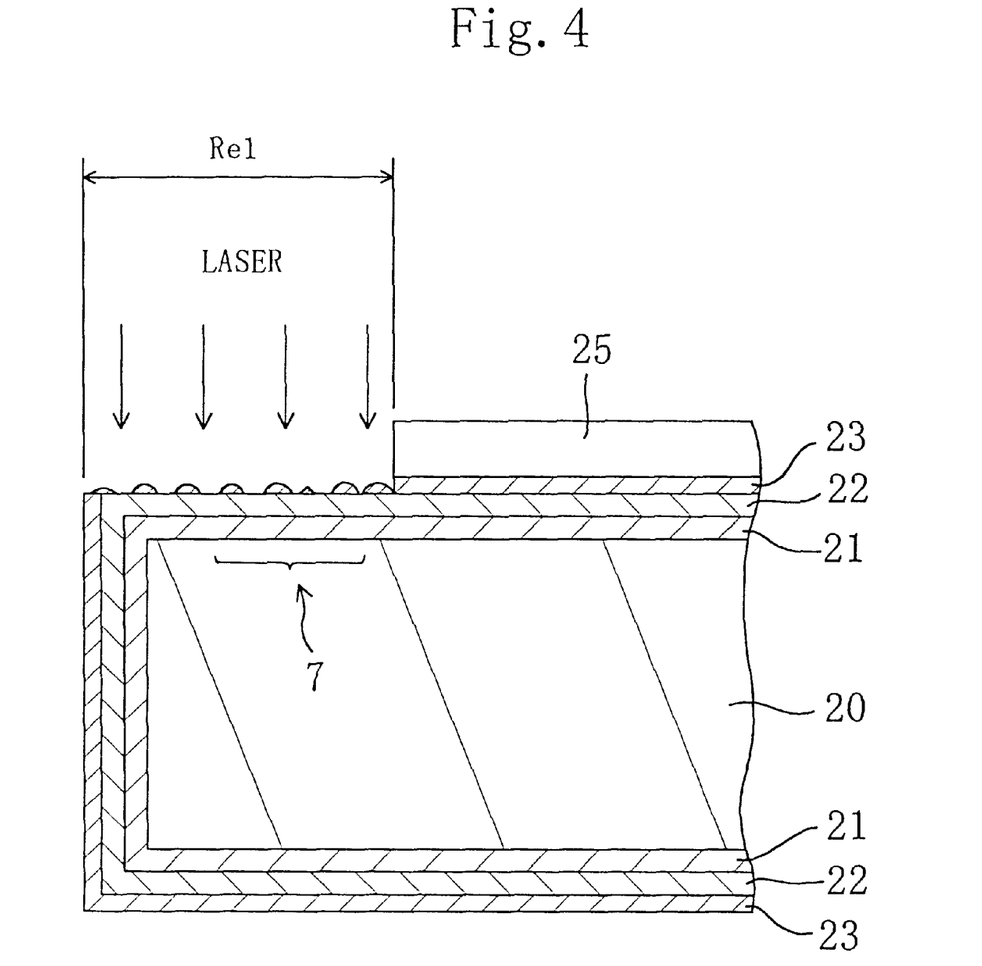
FIG. 4 is a sectional view for showing a procedure for making a gold layer coarse in an area including most of a gate runner portion in the lead frame of the second embodiment.

FIG. 4 is a sectional view of this lead frame after forming the outermost Au layer. As is shown in FIG. 4, the Ni layer 21, the Pd layer 22 and the Au layer 23 are successively stacked by plating on the body 20 of a copper alloy, and then, a photoresist mask 25 having an opening corresponding to the region Re1 including most of the gate runner portion 7 is formed. Then, the resultant lead frame is irradiated with a laser through the photoresist mask 25, thereby partially removing the Au layer 23 in the region Re1 to make it coarse.

In this embodiment, a semiconductor device is manufactured by using this lead frame for a resin sealed semiconductor device as follows:

First, a semiconductor chip is mounted on the die pad 1 of the lead frame, and the semiconductor chip is electrically connected with the inner leads 3 of the lead frame through wires. Then, an area including the semiconductor chip, the die pad 1, the inner leads 3 and the die-pad supports 2 (namely, a sealed area) is sealed with a sealing resin. The sealing resin is injected through the gate runner portion 7 of the lead frame, and the sealing resin remains in the gate runner portion 7 after completing the resin sealing procedure. Then, the sealing resin remaining in the gate runner portion 7 of the lead frame is peeled by, for example, punching the pilot holes 8 from the rear side, and subsequent procedures for marking, lead-cutting and lead-forming are carried out.

Since the Au layer having good adhesion to the sealing resin is coarsely formed in the region Re1, as indicated by element 34 in FIG. 3, including most of the gate runner portion 7 in this embodiment, the sealing resin is partially in contact with the Pd layer 22 below with poor adhesion. Therefore, the adhesion between the remaining sealing resin and the lead frame is degraded as a whole. As a result, after completing the resin sealing procedure, the sealing resin remaining in the gate runner portion 7 can be easily removed by punching the pilot holes 8 from the rear side with a small force. Thus, there is no need to punch the lead frame with a large force, and hence, the lead frame can be definitely prevented from being deformed.

In addition, there is no need to provide any additional element to the lead frame for degrading the adhesion. Therefore, the structure of this embodiment is free from any restriction in the manufacture and is suitable to the manufacturing conditions.

In this embodiment, the Au layer in the gate runner portion 7 is not entirely made coarse, but the entire Au layer in the gate runner portion 7 alone can be made coarse as described in the first embodiment. However, the process for making the Au layer coarse can be eased in this embodiment because the shape of the photoresist mask can be simplified.

The method of making coarse the Au layer in the gate runner portion 7 is not limited to the aforementioned method using the laser. For example, the region Re1 including the gate runner portion 7 or the entire gate runner portion 7 is ashed with $O_2$ by using a mask such as a photoresist mask, or alternatively the region Re1 or the gate runner portion 7 is slightly etched. Any of these methods can be appropriately selected in view of the cost and time required for the manufacture, etc.

Embodiment 3

A lead frame for a resin sealed semiconductor device according to a third embodiment will now be described with reference to FIGS. 5 and 6.

Figure 5:
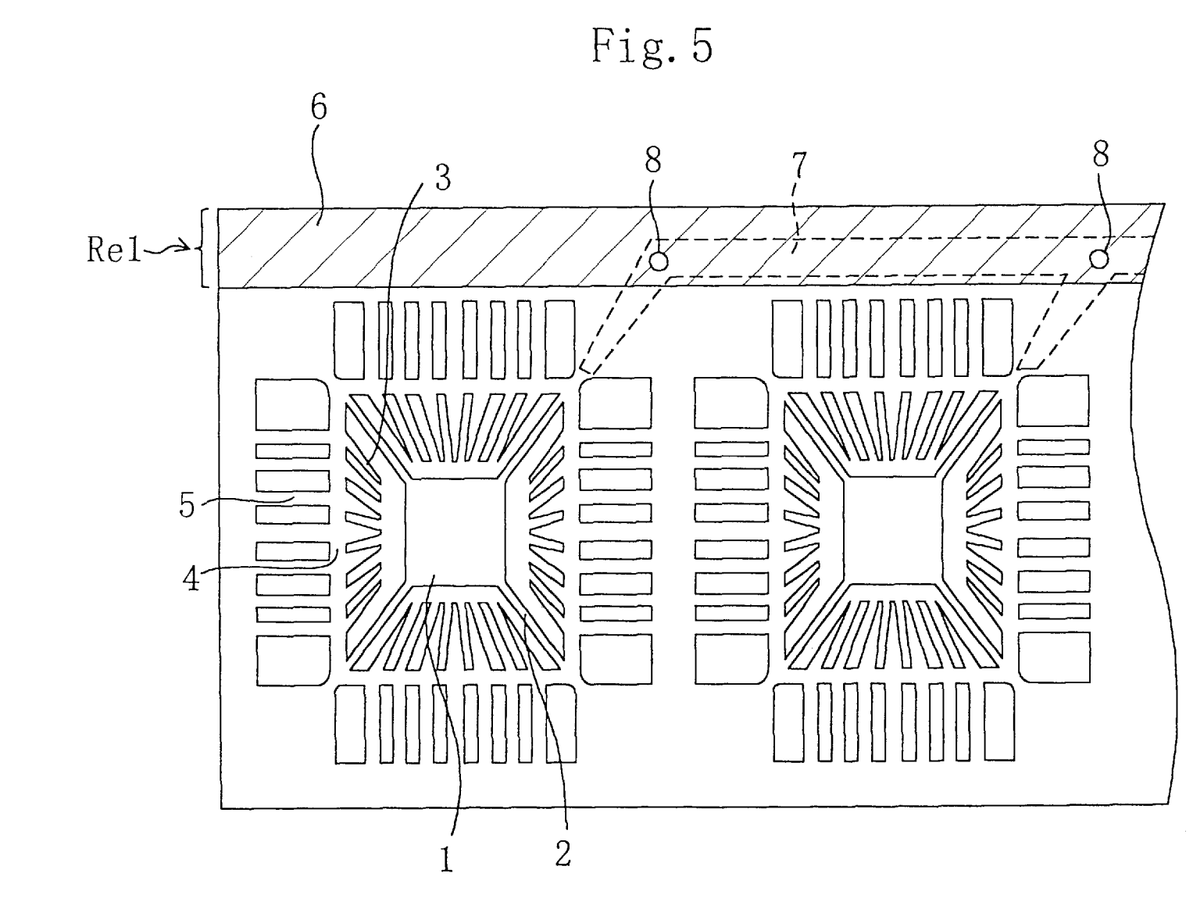
FIG. 5 is a plan view of a lead frame for a resin sealed semiconductor device according to a third embodiment.

FIG. 5 is a plan view of the lead frame for a resin sealed semiconductor device of this embodiment. As is shown in FIG. 5, the lead frame of this embodiment comprises a die pad 1, die-pad supports 2 for supporting the die pad 1, inner leads 3, dam-bars 4 for connecting the inner leads 3, outer leads 5 connected with the inner leads 3, and an outer frame 6 for externally supporting these elements. An area extending outward from substantially the base of the die-pad support 2 and further extending along the outer side of the outer frame 6 (i.e., an area surrounded with broken lines in FIG. 5) works as a gate runner portion 7 for allowing a sealing resin to flow to a cavity in a resin sealing procedure. The gate runner portion 7 is provided with pilot holes 8 used for positioning and removal of the sealing resin.

The lead frame is made from a body including copper (Cu) (or a copper alloy) as a substrate metal, and bearing a nickel (Ni) layer with a thickness of 0.5 $\mu$m and a palladium (Pd) layer with a thickness of 0.03 $\mu$m as underlying plate layers, and a gold (Au) layer with a thickness of 0.002 $\mu$m as the outermost layer.

Figure 6:
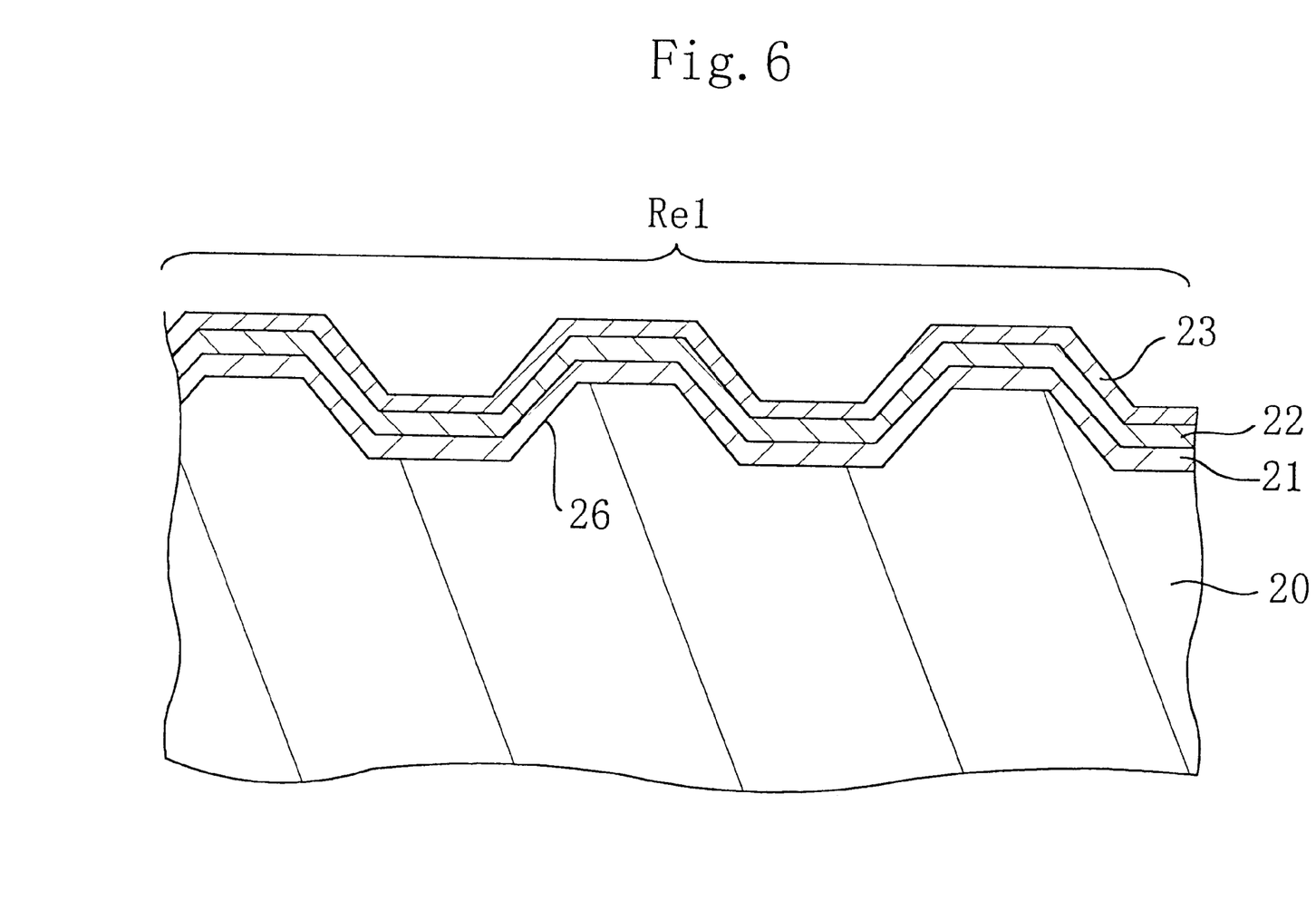
FIG. 6 is a sectional view for showing a procedure for forming irregularities in merely an area including most of a gate runner portion in the lead frame of the third embodiment.

As a characteristic of the lead frame of this embodiment, a region Re1 including most of the gate runner portion 7 (i.e., a hatched area in FIG. 5) is provided with irregularities 26 each having a trapezoidal section, namely, a tapered shape, as is shown in FIG. 6. Such irregularities 26 can be formed as follows: Before forming the plate layers on the lead frame, the region Re1 on the copper alloy body 20 of the lead frame is subjected to pressing, half-etching, etc., thereby forming the irregularities 26 in the region Re1. Then, the Ni layer 21, the Pd layer 22 and the Au layer 23 are successively stacked thereon. However, the method of forming the irregularities can be appropriately selected in view of the cost and time required for the manufacture.

In this embodiment, a semiconductor device is manufactured by using this lead frame for a resin sealed semiconductor device as follows:

First, a semiconductor chip is mounted on the die pad 1 of the lead frame, and the semiconductor chip is electrically connected with the inner leads 3 of the lead frame through wires. Then, an area including the semiconductor chip, the die pad 1, the inner leads 3 and the die-pad supports 2 (namely, a sealed area) is sealed with a sealing resin. The sealing resin is injected through the gate runner portion 7 of the lead frame, and the sealing resin remains in the gate runner portion 7 after completing the resin sealing procedure. Then, the sealing resin remaining in the gate runner portion 7 of the lead frame is peeled by, for example, punching the pilot holes 8 from the rear side, and subsequent procedures for marking, lead-cutting and lead-forming are carried out.

The irregularities 26 formed in the region Re1 including most of the gate runner portion 7 in this embodiment bring the following function: The sealing resin remaining in the gate runner portion 7 and the lead frame are shrunk in accordance with the decrease of the temperature after completing the resin sealing procedure. However, due to a difference in the coefficient of thermal expansion, the lead frame is more largely shrunk than the remaining sealing resin. This thermal stress causes a force to separate the sealing resin from the lead frame on the side faces of the irregularities 26 each having the tapered shape. As a result, the sealing resin thrust into the irregularities 26 is peeled. Accordingly, the adhesion between the remaining sealing resin and the lead frame is degraded, so that the remaining sealing resin can be easily removed by punching the pilot holes 8 from the rear side with a relatively small force. In this manner, there is no need to punch the lead frame with a large force, resulting in preventing the lead frame from being deformed.

In addition, there is no need to provide any additional element to the lead frame for degrading the adhesion, and the structure of this embodiment is free from any restriction in the manufacture and is suitable to the manufacturing conditions.

In this embodiment, the irregularities are not provided to the entire gate runner portion 7, but they can be formed in the gate runner portion 7 alone as described in the first embodiment. However, the irregularities described in this embodiment can be formed more easily because the region Re1 is simplified in its shape.

Also, the irregularities 26 formed in the region Re1 including the gate runner portion 7 is not limited in their shapes to that with the trapezoidal section as described above, but the irregularities can include, for example, recesses with a reverse triangle section. Alternatively, the irregularities can include a large number of cone-shaped projections. In other words, the irregularities can be of any shape as far as they have tapered side faces so that the sealing resin can be peeled due to the difference in the coefficient of thermal expansion resulting from the thermal shrink after completing the resin sealing procedure.

In addition to the formation of the irregularities in the region Re1 as in this embodiment, the Au layer in the region Re1 or in the gate runner portion 7 can be eliminated as in the first embodiment or can be made coarse as in the second embodiment. Thus, the same effect can be attained.

What is claimed is:

1. A lead frame for a resin sealed semiconductor device made from a body of copper or a copper alloy, and a nickel layer, a palladium layer and a gold layer successively formed thereon, comprising:

a sealed portion which is sealed with a sealing resin; and a gate runner portion for introducing said sealing resin to said sealed portion.

wherein said gate runner portion has an area where no gold layer is formed so that said palladium layer is exposed.

2. A lead frame for a resin sealed semiconductor device made from a body of copper or a copper alloy, and a nickel layer, a palladium layer and a gold layer successively formed thereon, comprising:

a sealed portion which is sealed with a sealing resin; and a gate runner portion for introducing said sealing resin to said sealed portion, wherein said gate runner portion has an area which has gold sporadically disposed thereon so that said palladium layer is sporadically exposed.

3. A lead frame for a resin sealed semiconductor device made from a body of copper or a copper alloy, and a nickel layer, a palladium layer and a gold layer successively formed thereon, comprising:

a sealed portion which is sealed with a sealing resin; and a gate runner portion for introducing said sealing resin to said sealed portion, wherein said gate runner portion has an area where irregularities each with a tapered side face are formed, said nickel layer, said palladium layer and said gold layer being deposited over said area having said irregularities such that said nickel layer, said palladium layer and said gold layer have a shape conforming to said irregularities.

4. The lead frame for a resin sealed semiconductor device of claim 3, wherein no gold layer is formed in said area including at least a part of said gate runner portion.

5. The lead frame for a resin sealed semiconductor device of claim 3, wherein said gold layer is coarsely formed in said area including at least a part of said gate runner portion.

* * * * *

UNITED STATES PATENT AND TRADEMARK OFFICE
CERTIFICATE OF CORRECTION

PATENT NO. : 5,929,511
DATED : July 27, 1999
INVENTOR(S) : Nakazawa et al.

It is certified that error appears in the above-identified patent and that said Letters Patent is hereby corrected as shown below:

On the Title page, item [56] U.S. Patent Documents" section:

Delete "5,753,968 5/1998 Suzuya et al. 257/667" and insert --5,753,969 5/1998 Suzuya et al. 257/667--.

On the Cover page, in the "Other Publications" section:

In the first reference, change "Seated" to --Sealed Type-- and change "Yorchi" to --Masahiro--.

In the second reference, change "Yorchi" to --Yoichi-- and change "040250314" to --04025054--.

Signed and Sealed this

Twenty-third Day of January, 2001

Attest:

Q. TODD DICKINSON

*Attesting Officer*

*Commissioner of Patents and Trademarks*